United States Patent [19]

Gilbert et al.

[11] Patent Number: 5,147,812

[45] Date of Patent: Sep. 15, 1992

[54] FABRICATION METHOD FOR A SUB-MICRON GEOMETRY SEMICONDUCTOR DEVICE

[75] Inventors: James G. Gilbert, Tempe; Fourmun Lee, Chandler; Thomas Zirkle, Tempe, all of Ariz.

[73] Assignee: Motorola, Inc., Schaumburg, Ill.

[21] Appl. No.: 861,734

[22] Filed: Apr. 1, 1992

[51] Int. Cl.$^5$ .......................................... H01L 21/265
[52] U.S. Cl. ...................................... 437/41; 437/35; 437/40; 437/912; 148/DIG. 106; 148/DIG. 102
[58] Field of Search .................... 437/41, 40, 912, 29, 437/35, 31; 148/DIG.106, DIG. 102

[56] References Cited

U.S. PATENT DOCUMENTS

| | | | |
|---|---|---|---|
| 4,455,738 | 6/1984 | Houston et al. | 437/912 |
| 4,472,872 | 9/1984 | Toyoda et al. | 437/912 |
| 4,689,869 | 9/1987 | Jambotkar | 437/44 |
| 5,024,971 | 6/1991 | Baker et al. | 437/41 |
| 5,040,035 | 8/1991 | Gabara et al. | 437/41 |

OTHER PUBLICATIONS

M. D. Levenson et al., "Improving Resolution in Photolithography with a Phase-Shifting Mask", *IEEE Trans. on Electron Devices*, vol. ED-29, No. 12, Dec. 1982, pp. 1828–1836.
M. D. Levenson et al., "The Phase-Shifting Mask II: Imaging Simulations and Submicrometer Resist Exposures", *IEEE Trans. on Electron Devices*, vol. ED-31, No. 6, Jun. 1984, pp. 753–762.
A. K. Pfau et al., "Exploration of Fabrication Techniques for Phase-Shifting Masks", Mar., 1991.
M. Inoue et al., "Trends in Phase Shift Lithography", *Semiconductor World*, Dec. 1990.
P. Down, "Phase-Shift Masks (The Technology that is Changing the Lithography Lanscape)", *Electronic News*, Monday, May 20, 1991.
P. Burgglaaf, "Four More Significant Japanese Advances in Phase-Shifting Technology", *Semiconductor Intenational*, Dec. 1991, p. 16.

*Primary Examiner*—Brian E. Hearn
*Assistant Examiner*—Kevin M. Picardat
*Attorney, Agent, or Firm*—Joe E. Barbee

[57] ABSTRACT

A method for fabricating a sub-micron geometry semiconductor device using a chromeless mask. An optical exposure system (22) directs light through a chromeless mask (21). The chromeless mask (21) uses destructive interference of light to pattern a light sensitive material (32) on a semiconductor wafer (28). Phase differences in light passing thru chromeless mask (21) creates dark regions which form a non-exposed area of light sensitive material (37). The exposed light sensitive material is removed. The non-exposed area of light sensitive material (37) which remains, protects the gate material underneath it, as all other gate material is removed from the wafer. The non-exposed area of light sensitive material (37) is removed leaving a sub-micron gate (39). A drain and source is then formed to complete the device.

20 Claims, 4 Drawing Sheets

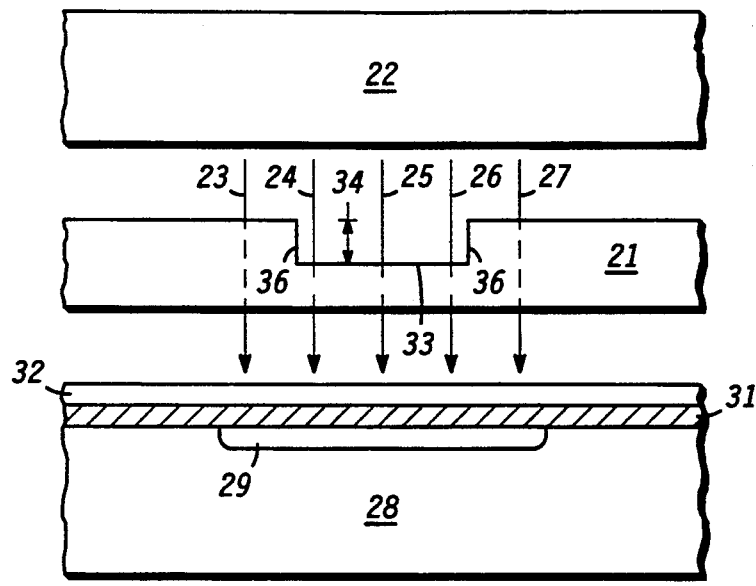
FIG. 1
FIG. 2
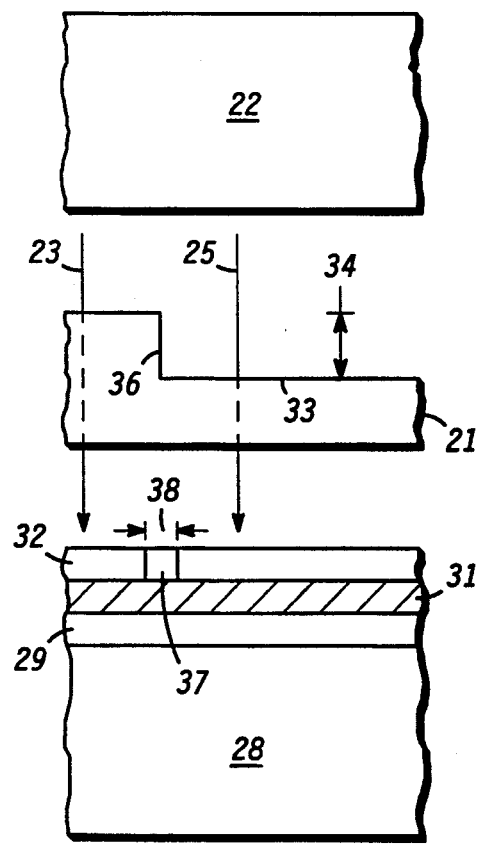

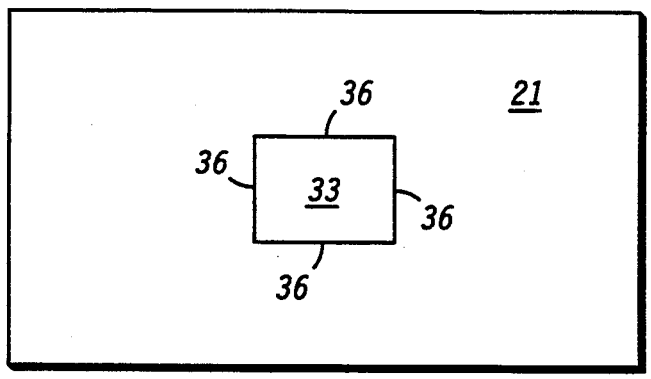
FIG. 3
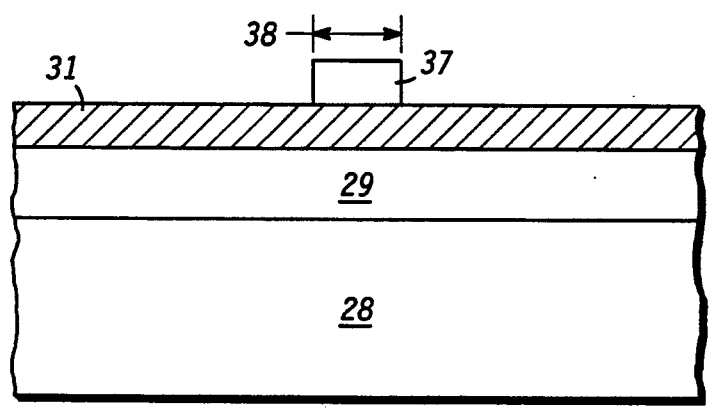
FIG. 4
FIG. 5
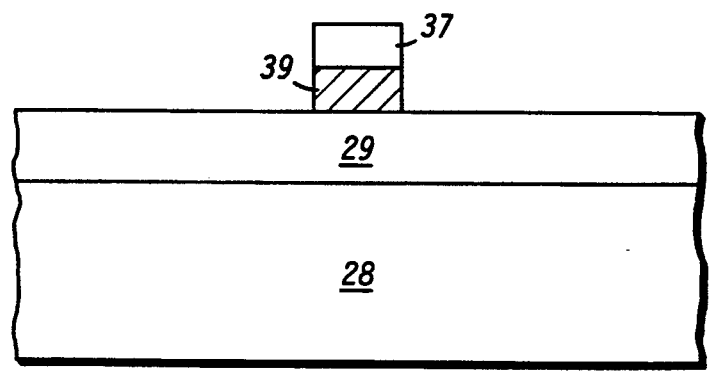

FABRICATION METHOD FOR A SUB-MICRON GEOMETRY SEMICONDUCTOR DEVICE

BACKGROUND OF THE INVENTION

This invention relates, in general, to sub-micron gate length semiconductor device fabrication, and more particularly to gallium arsenide MESFET fabrication with sub-micron gate lengths.

Optical photolithographic techniques used to manufacture semiconductor devices are limited in resolution due to aperture diffraction effects. For any given semiconductor photolithographic system, a balance must be achieved between the minimum feature size allowed on silicon and the ability to manufacture the minimum feature size in a production environment with an acceptable yield loss. Investment in new equipment having higher resolution can be prohibitive from a cost standprint.

Projection step and repeat technology is commonly used throughout the semiconductor industry. An I-line projection stepper which operates at a wavelength of 365 nanometer (nm) and has a 0.52 numerical aperture (NA) can form gallium arsenide (GaAs) MESFETs with 0.5 micron gate lengths under practical applications. Building smaller geometry MESFETs (less than 0.5 micron gate lengths) with this equipment may see a drastic increase in defects which translates into increased yield losses.

Other methods in research and development labs have been used to create small MESFET geometries. Examples of these techniques are E-beam lithography, DUV lithography, and process changes such as deliberate undercutting during gate metal etch. These methods have not been successfully implemented in a production environment at this time.

Gallium arsenide MESFET circuitry is commonly used in high performance systems. These high performance systems can only be built if MESFET speed is capable of meeting the performance criteria of the system. MESFET maximum operating frequency is a function of the gate length. For example, a MESFET having a 0.5 micron gate length will have an approximate maximum operating frequency of 18 Ghz. Typically, smaller gate lengths will increase MESFET maximum operating frequency. It would provide a great benefit if a MESFET which has a higher maximum operating frequency could be developed using existing I-line projection steppers and could be manufactured in a production environment.

SUMMARY OF THE INVENTION

Briefly stated, this invention is a method for fabricating a sub-micron device. A gate material is placed on a semiconductor wafer. A light sensitive material is placed on the gate material. A chromeless mask modified in a predetermined area to phase shift light is used to pattern the light sensitive material. Light passing through the non-modified mask adjacent to phase shifted light passing through the modified predetermined area diffracts and destructively interferes with each other projecting a dark region on the semiconductor wafer. The projected dark region is a sub-micron line which corresponds to the area where the unmodified mask transitions to the modified area, the projected dark region forms a closed loop. Exposed light sensitive material on the gate material is removed. Gate material is then removed from the wafer except gate material underneath the non-exposed light sensitive material. The non-exposed light sensitive material is removed leaving a sub-micron gate. A self-aligned drain or source is formed on either side of the sub-micron gate.

BRIEF DESCRIPTION OF THE DRAWINGS

FIG. 1 is a cross-sectional view of a system to pattern light on a semiconductor wafer;

FIG. 2 is an enlarged view of FIG. 1 showing increased detail of the system;

FIG. 3 is a plan view of the chromeless mask used in FIG. 1;

FIG. 4 is a cross-sectional view of FIG. 2 after removal of exposed photo sensitive material;

FIG. 5 is a cross-sectional view of FIG. 4 after removal of unprotected metal;

DETAILED DESCRIPTION OF THE DRAWINGS

Figure 6:
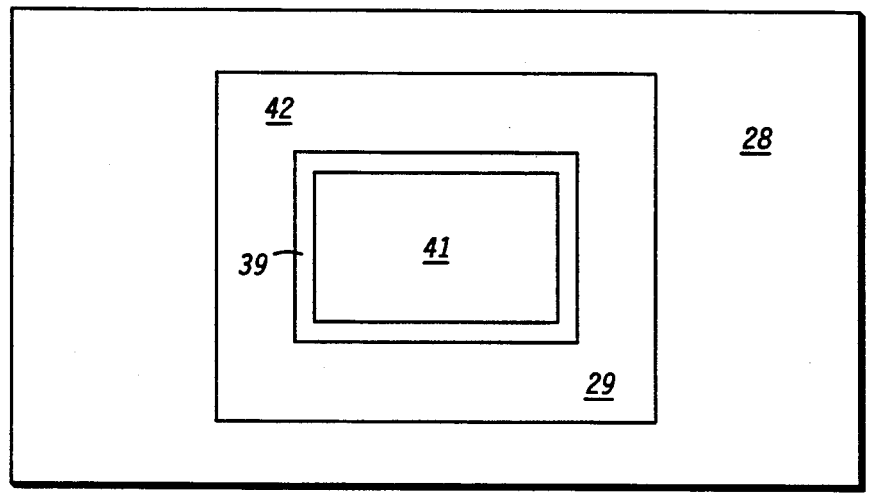
FIG. 6 is a top view of a semiconductor die illustrating a metal gate in accordance with the present invention.

FIG. 1 is a cross-sectional view of a semiconductor photolithographic system used for patterning light on a semiconductor wafer. A mask 21 is used in the semiconductor photolithographic system for patterning projected light onto a semiconductor wafer. The projected light comes from an optical exposure system 22 such as an I-line stepper which exposes light sensitive material on a semiconductor wafer 28. Light projected from optical exposure system 22 is indicated by arrows 23–27.

An I-line stepper can be characterized by its numerical aperture and average wavelength of projected light. A common I-line stepper has a numerical aperture of 0.52 and an average wavelength is 365 nanometers. Resolution of a projected image using the 365 nanometer I-line stepper is approximately 0.5 microns in a production environment using standard chrome masks.

Mask 21 is transmissive to light projected from optical exposure system 22 and is chromeless. Mask 21 patterns light from optical exposure system 22 on semiconductor wafer 28 using phase shift techniques. In the preferred embodiment, a MESFET which has sub-micron gate lengths is formed on a gallium arsenide wafer. A dopant is implanted in semiconductor wafer 28 to form a conductive area 29. Conductive area 29 is a fabrication area where sub-micron gate length device is formed. An epi layer could also be used to form conductive area 29. A gate material 31 is placed on the surface of semiconductor wafer 28. A light sensitive material 32 is placed on gate material 31.

In the preferred embodiment, mask 21 is a chromeless quartz mask. Mask 21 is modified in a predetermined area 33. Predetermined area 33 is etched to a predetermined depth which is indicated by bracketed line 34. A transition region 36 is defined as an area where unmodified area of mask 21 transitions to the etched predetermined area 33. Transition region 36 borders the circumference of predetermined area 33. In the preferred embodiment, transition region 36 is formed as a vertical transition as shown in FIG. 1.

Standard chrome masks are used differently than etched chromeless mask 21. Chrome masks are commonly used to fabricate MESFET devices. Chrome is patterned on a mask to block light from an optical exposure system from exposing areas on a semiconductor wafer surface. The projected resolution on the semiconductor wafer is limited by aperture diffraction effects. For example, a chrome mask having two non-chromed areas separated by a very small chrome strip can be used to describe aperture diffraction effects. Each non-chromed area forms an aperture where light is transmitted through to the semiconductor wafer. Ideally, light from an optical exposure system would expose the wafer surface only in areas which correspond to the two openings. A shadow or dark region would occur between the two light exposed areas due to the strip of chrome blocking the light. In reality, light is diffracted by the mask. Some of the diffracted light will illuminate the dark region. As the chrome strip is reduced in width, light diffracted from the two apertures will both contribute to illuminating the dark region. The chrome strip width can be reduced to the point where the diffracted light from either aperture adds together in the dark region, possibly enough to expose material which is not intended to be exposed in the dark region. How small chromed areas can be made before diffraction effects expose light in dark areas and conversely how small non-chromed areas can be made before light does not sufficiently expose the wafer surface determines the resolution of a chromed mask photolithographic system using a specific optical exposure system. The resolution can be increased by using an optical exposure system which has a shorter average light wavelength or a lens system with high numerical aperture.

The speed at which a MESFET can operate is a direct function of the MESFET gate length. There are many commercial advantages to offering faster components than the competition. An I-line stepper which projects light having a 365 nanometer wavelength and has a 0.52 numerical aperture can be used with chrome masks to fabricate MESFETs with gate lengths of approximately 0.5 microns in a production environment. Building MESFETs which have gate lengths less than 0.5 microns is possible using chrome masks but device yield would not make production feasible from a cost standpoint.

FIG. 2 is an enlarged view of FIG. 1 showing an unexposed cross-sectional area 37 of light sensitive material printed using a chromeless mask 21. Unlike a chrome mask, interference effects are used in chromeless mask 21 to form unexposed light sensitive material 37. Predetermined area 33 is etched to a predetermined depth indicated by bracketed line 34. The predetermined depth is chosen to phase shift light passing through etched predetermined area 33 when compared with light passing through unmodified area of chromeless mask 21. Light passing through etched predetermined area 33 is indicated by arrow 25. Light passing through unmodified area of chromeless mask 21 is indicated by arrow 23. In the preferred embodiment, predetermined depth 34 is chosen to phase shift light passing through the etched predetermined area 33 by 180 degrees from light passing through the unmodified areas of chromeless mask 21. Predetermined depth 34 of etched predetermined area 33 can be calculated from the following equation, (wavelength of light/($2 \times (N-1)$)), where the wavelength of light is equal to the wavelength of light from optical exposure system 22, and N is the refractive index of the medium through which light travels. In the preferred embodiment, chromeless mask 21 is made of quartz, N used for this calculation should be the refractive index of quartz.

Optical exposure system 22 is aligned to chromeless mask 21. Chromeless mask 21 is aligned to semiconductor wafer 28. Alignment is critical to insure patterns on chromeless mask 21 are projected to appropriate areas on semiconductor wafer 28. Projected light from optical exposure system 22 passes through chromeless mask 21 to expose light sensitive material 32. In the preferred embodiment, light sensitive material 32 is a positive photoresist. Positive photoresist used in processing semiconductor devices is easily removed after it has been exposed by light. Non-exposed positive photoresist which remains is used to pattern material on a semiconductor wafer. Negative photoresist can also be used in conjunction with a chromeless mask. Negative photoresist operates opposite to positive photoresist in that non-exposed positive photoresist is easily removed from a semiconductor wafer.

Interference effects occur near transition region 36 due to the transition itself. Light from unmodified area of chromeless mask 21 near transition region 36 interferes with light from etched predetermined area 33 near transition region 36. Light from etched predetermined area 33 is 180 degrees out of phase with light from an unmodified area of chromeless mask 21, the mixing of out of phase light is destructive. All other areas on semiconductor wafer 28 where destructive interference does not occur is exposed by optical exposure system 22. Non-exposed light sensitive material 37 corresponds to light projected through chromeless mask 21 near transition region 36. Non-exposed light sensitive material 37 has a width indicated by a bracketed line 38. The width of non-exposed light sensitive material 37 is a function of the numerical aperture and wavelength of light from optical exposure system 22 and the profile of transition region 36. The profile of transition region 36 affects light diffraction. Controlling the profile of transition region 36 dictates how much destructive interference occurs and forms the area of non-exposed light sensitive material. In the preferred embodiment, transition region 36 transitions vertically from an unmodified area of chromeless mask 21 to the predetermined depth 34 of etched predetermined area 33.

An I-line stepper which operates at a 365 nanometer wavelength and has a numerical aperture of 0.52 can be used with an etched chromeless mask to form an area of non-exposed positive photoresist which has widths ranging from 0.2–0.45 microns. This flow can be implemented for use in a production environment. Using destructive interference to pattern photoresist increases resolution of an I-line stepper when compared with semiconductor wafers patterned with chrome masks. The increased resolution of the chromeless mask is used to form a device which has smaller gate lengths and will increase performance of the device to be fabricated.

FIG. 3 is a top view of chromeless mask 21 showing etched predetermined area 33. Etched predetermined area 33 is illustrated as a rectangular shape but is not limited to this configuration. Transition region 36 borders the rectangular etched predetermined area 33.

FIG. 4 is an illustration showing non-exposed light sensitive material 37. Exposed light sensitive material is removed from semiconductor wafer 28 leaving non-exposed light sensitive material 37. Gate material 31 and conductive area 29 are unaffected by the removal of exposed light sensitive material.

FIG. 5 is an illustration showing a metal gate 39 formed from layer 31 (FIG. 4). In the preferred embodiment, gate material placed on semiconductor wafer 28 is metal. Gate material which is not protected by non-exposed light sensitive material 37 is removed from semiconductor wafer 28 leaving the metal gate 39.

FIG. 6 is a top view of semiconductor wafer 28 illustrating metal gate 39. Non-exposed light sensitive material 37 (FIG. 5) on metal gate 39 is removed. Metal gate 39 forms a closed loop in the shape of the projected image from the transition region 36 of FIG. 3 due to destructive interference of light passing through unmodified areas of mask 21 of FIG. 3 and light passing through etched predetermined area 33 of FIG. 3 near transition region 36 of FIG. 3.

Metal gate 39 forms a Schottky junction with conductive area 29. The Schottky junction forms a depletion region into conductive area 29 which isolates an interior area 41 from an exterior area 42. Interior area 41 and exterior area 42 form a drain or a source region for the MESFET. Interior area 41 is the portion of conductive area 29 inside the closed loop metal gate 39. Exterior area 42 is the portion of conductive area 29 which is outside of closed loop metal gate 39.

Closed loop metal gate 39 creates a depletion region into conductive area 29 (under closed loop metal gate 39) which reduces or eliminates a conductive path from interior area 41 to exterior area 42. Biasing closed loop metal gate 39 at a voltage which reduces the depletion region will increase the conductive path from interior area 41 to exterior area 42. Also, additional implants for lowering resistance or for forming contacts may be needed to build the drain and source areas. The closed loop metal gate 39 can be used to self align the additional implants to the MESFET device.

Figure 7:
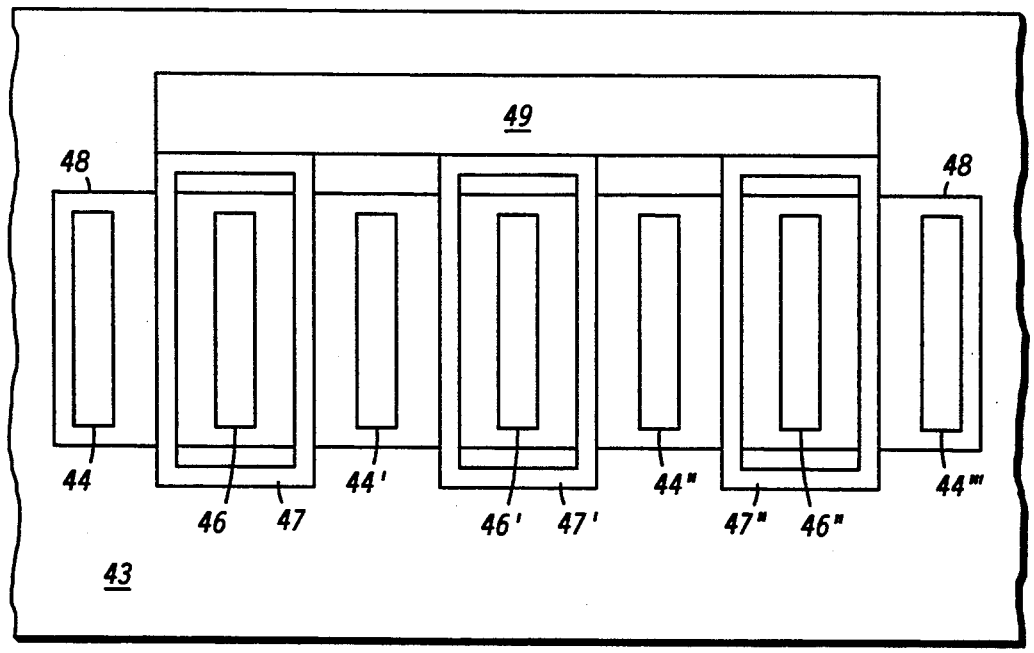
FIG. 7 is an illustration of a device made from a plurality of closed loop gates.

FIG. 7 is a top view of a multiple gate MESFET configuration using closed loop metal gates 47, 47', and 7" formed by phase shift destructive interference on a gallium arsenide wafer 43. In the preferred embodiment, a plurality of layers of metal are available for interconnecting to different areas of the MESFET. Conductive area 48 is implanted in gallium arsenide wafer 43. In the preferred embodiment, closed loop metal gates 47, 47', and 47" are formed using the method described in FIGS. 1-6. Closed loop metal gates 47, 47', and 47" differ from closed loop metal gate 39 of FIG. 6 in that two sides extend past conductive area 48. The two sides which extend past conductive area 48 do not separate drain and source areas of the MESFET. Closed loop metal gates 47, 47', and 47" are coupled together by metal strap 49 which contacts a side of each gate which extends past conductive area 48.

A drain contact area is illustrated by rectangular boxes 44, 44', 44", and 44'". Drain contact areas 44, 44', 44", and 44'" are coupled together using one of the plurality of metal layers for interconnect. A source contact area is illustrated by rectangular boxes 46, 46', and 46". Source contact areas 46, 46', and 46" are coupled together using metal interconnect which may traverse closed loop metal gates 47, 47', and 47" and metal used to couple drain contact areas 44, 44', 44", and 44'".

Multiple gate devices are commonly used to form a device which has a low channel resistance. Using the method for fabricating a sub-micron gate length device, a multiple gate device can be built which has a low channel resistance with the added benefit of higher frequency response due to smaller gate lengths.

Figure 8:
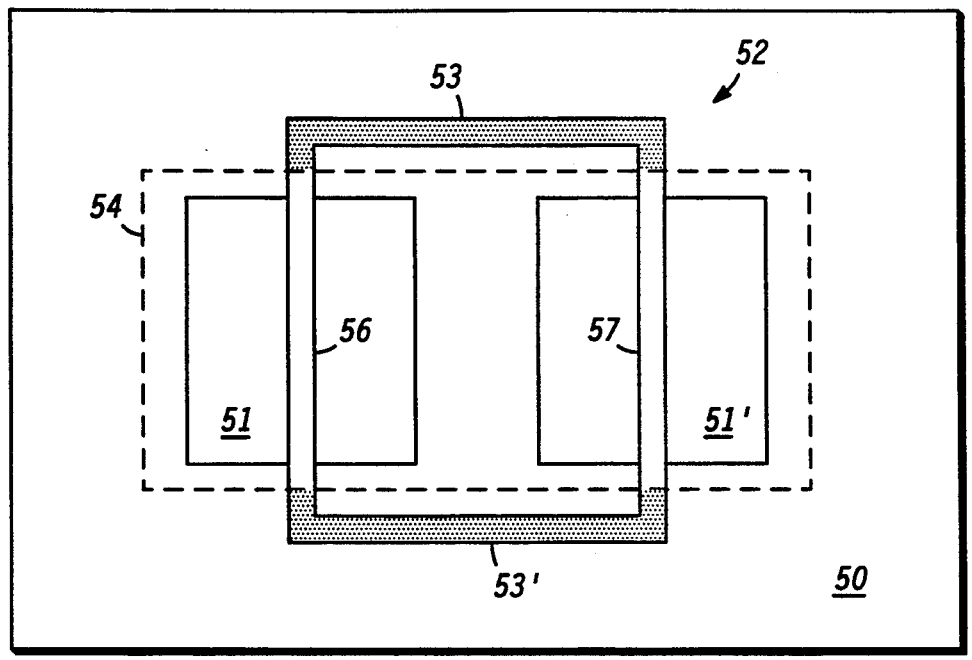
FIG. 8 is an illustration showing the fabrication of two separate devices from a single closed loop gate.

FIG. 8 is a top view of a closed loop of light sensitive material 52 illustrating an alternative embodiment used for exposing additional areas of the closed loop of light sensitive material 52 covering wafer 50. By further exposing the closed loop of light sensitive material 52, two separate gates can be formed from which two separate sub-micron gate length devices are built.

Two separate conductive areas 51 and 51' are implanted in a gallium arsenide wafer 50. The two separate conductive areas are used to form two separate MESFET devices.

In the preferred embodiment, light sensitive material 52 is positive photoresist. A closed loop of positive photoresist 52 is formed using the method described in FIGS. 1-6. A first side 53 and a second side 53' of non-exposed positive photoresist 52 is indicated by a stipple pattern. Sides 53 and 53' are not within conductive areas 51 and 51'.

A second step for exposing first side 53 and second side 53' of closed loop of light sensitive material 52 is added. The second step uses a chrome mask to re-expose gallium arsenide wafer 50. Chromed areas on the chrome mask block light from an optical exposure system from exposing an area of light sensitive material enclosed by dotted line 54. The chromed mask is aligned to gallium arsenide wafer 50. The optical exposure system projects light through unchromed areas of the chromed mask exposing gallium arsenide wafer 50 in corresponding areas. Light blocked from exposing gallium arsenide wafer 50 by a corresponding chrome area on the chrome mask is indicated by dotted line forming rectangle 54. Light from the optical exposure system passes through the chrome mask exposing first side 53 and second side 53'.

Exposed positive photoresist is removed from gallium arsenide wafer 50 leaving a first sub-micron line of non-exposed positive photoresist 56 and a second sub-micron line of non-exposed positive photoresist 57.

All gate material is removed except gate material protected by sub-micron lines of non-exposed positive photoresist 56 and 57. Sub-micron lines of non-exposed positive photoresist 56 and 57 is then removed leaving a first and a second gate which can be used as a mask when forming source and drain areas; thereby, making the source and drain areas self-aligned to the first and second gates.

Figure 9:
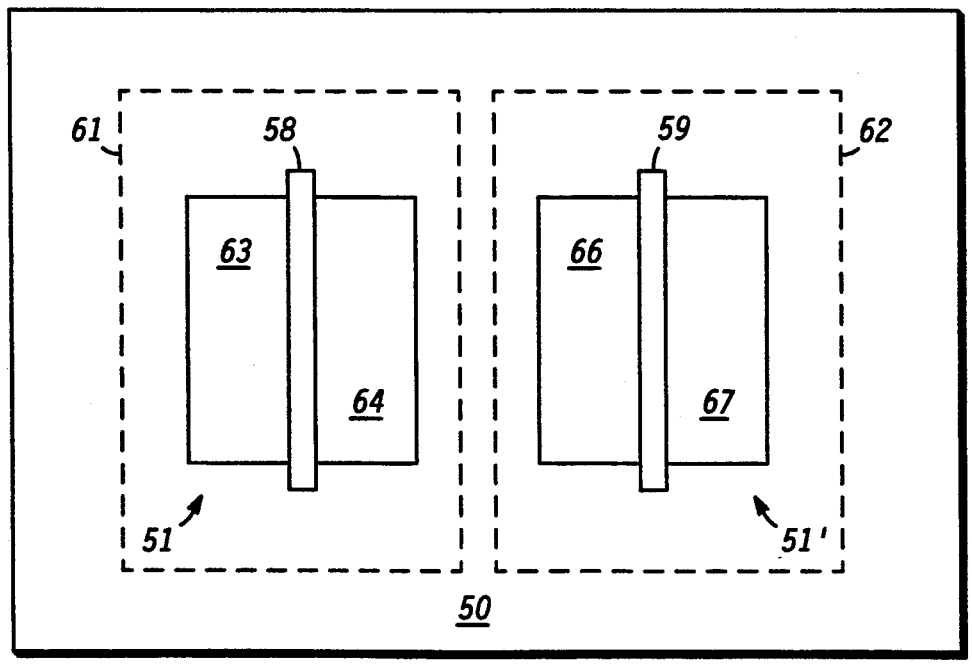
FIG. 9 is an illustration showing two separate devices.

FIG. 9 is a further illustration of the formation of two separate devices having sub-micron gate lengths described in FIG. 8.

A first gate 58 and a second gate 59 is formed on gallium arsenide wafer 50 using a chromed mask as described in FIG. 8.

A first MESFET device 61 comprises gate 58 and conductive area 51. Gate 58 forms a depletion region into conductive area 51. A first area 63 and a second area 64 in conductive area 51 is separated by the depletion region under gate 58. A drain or source is formed in first and second areas 63 and 64. Biasing gate 58 at a predetermined voltage reduces the depletion region which generates a conductive path from drain to source.

Likewise, a second MESFET device 62 comprises gate 59 and conductive area 51'. A drain or source is formed in an area 66 and an area 67 of conductive area 51'. Second MESFET device 62 has a drain, source, and gate completely separate from first MESFET device 61 even though they were initially formed from the closed loop of non-exposed positive photo resist.

By now it should be appreciated that there has been given a method for fabricating a device with sub-micron gate lengths. For a given optical exposure system, using a chromeless mask with modifications for phase shift destructive interference to form patterns on a semiconductor wafer will allow the fabrication of smaller geometry shapes than using a standard chrome mask.

Light sensitive material is patterned on a semiconductor wafer using the chromeless masks. The light sensitive material is used to form gates which have sub-micron gate lengths. Drain and source regions for the device are formed in a conventional manner using the sub-micron gates as masks thereby making the source and drain self-aligned to the gates. The method of printing sub-micron gate lengths with a chromeless phase shift mask is applicable with both existing optical exposure systems as well as future optical exposure systems. This fabrication method allows formation of smaller gate lengths (which corresponds to higher performance devices) than a standard chrome mask flow.

We claim:

1. A fabrication method for a sub-micron geometry semiconductor device comprising:
    identifying a fabrication area on a semiconductor wafer;
    implanting a dopant in the fabrication area;
    placing a gate material on the semiconductor wafer over the fabrication area;
    placing a light sensitive material on the gate material;
    providing an optical exposure system for exposing light sensitive material;
    providing a chromeless mask transmissive to light from the optical exposure system which has a modified area for phase shifting light;
    aligning the optical exposure system to the chromeless mask;
    aligning the chromeless mask to the semiconductor wafer;
    exposing light sensitive material on the semiconductor wafer with light from the optical exposure system which passes through the chromeless mask to the semiconductor wafer surface;
    forming a sub-micron non-exposed line on the light sensitive material using destructive interference of diffracted light due to phase shift differences projected from the chromeless mask, wherein the sub-micron non-exposed line of light sensitive material forms a closed loop;
    removing the exposed light sensitive material;
    removing gate material which is not protected by the non-exposed line of light sensitive material;
    removing the non-exposed light sensitive material, thereby leaving a sub-micron gate on the semiconductor wafer formed in a closed loop; and
    forming a source and drain for the semiconductor device which are adjacent to the sub-micron gate.

2. The fabrication method for a sub-micron geometry semiconductor device of claim 1, further including:
    controlling the wavelength and numerical aperture of the light from the optical exposure system, wherein the light wavelength and numerical aperture affects the resolution to which the light sensitive material can be exposed.

3. The fabrication method for a sub-micron geometry semiconductor device of claim 2, further including:
    providing a chromeless mask made of quartz, wherein the quartz is transmissive to the light from the optical exposure system.

4. The fabrication method for a sub-micron geometry semiconductor device of claim 3, further including:
    etching the chromeless mask in a predetermined area, to a predetermined depth, to create a phase shift difference between light passing through the unetched portion of the chromeless mask and the etched predetermined area; and
    defining boundary of the etched predetermined area as a transition region where the unetched portion of the chromeless mask transitions to the etched predetermined depth.

5. The fabrication method for a sub-micron geometry semiconductor device of claim 4, further including:
    choosing the predetermined depth of the etched predetermined area to provide a 180 degree phase shift differential between light passing through the unetched portion of the chromeless mask and light passing through the etched predetermined area.

6. The fabrication method for a sub-micron geometry semiconductor device of claim 5, further including:
    forming the transition region as a vertical step to the etched predetermined depth.

7. The fabrication method for a sub-micron geometry semiconductor device of claim 6, further including:
    providing positive photoresist as the light sensitive material.

8. The fabrication method for a sub-micron geometry semiconductor device of claim 1, further including:
    using the sub-micron gate to self align the drain and source.

9. The fabrication method for a sub-micron geometry semiconductor device of claim 8, further including:
    forming a plurality of gates which have sub-micron gate lengths and are shaped in a closed loop;
    coupling the plurality of sub-micron gates to form a common gate;
    forming a plurality of sources and drains;
    coupling drains together to form a common drain; and
    coupling sources together to form a common source, thereby forming a multiple gate device which has sub-micron gate lengths.

10. The fabrication method for a sub-micron geometry semiconductor device of claim 1, further including:
    providing a plurality of fabrication areas on the semiconductor wafer in which separate semiconductor devices can be formed;
    forming a sub-micron line of non-exposed light sensitive material in each of the fabrication areas in a closed loop shape;
    providing a mask patterned with chrome in predetermined areas, the chrome patterned mask is used after light sensitive material has been exposed with the chromeless mask, the chrome patterned mask is used to expose areas of the sub-micron line of light sensitive material to form isolated sections of non-exposed light sensitive material corresponding to each fabrication area;
    aligning the chrome patterned mask to the semiconductor wafer;
    projecting light from the optical exposure system through the chrome patterned mask, wherein the light exposes predetermined areas of the sub-micron closed loop shape of non-exposed light sensitive material;

removing exposed light sensitive material, thereby forming isolated sections of non-exposed light sensitive material;

removing gate material which is not protected by the non-exposed light sensitive material, thereby forming isolated gates in each separate area where a semiconductor device can be formed;

removing the non-exposed light sensitive material; and forming a source and drain for each isolated gate, thereby forming a plurality of isolated semiconductor device.

11. The fabrication method for a sub-micron geometry semiconductor device of claim 3, further including:

adding a layer of transmissive material in the predetermined area of the chromeless quartz mask, the layer of transmissive material has a predetermined height, the added height and material difference creates a phase shift difference between light passing through the unmodified mask area and the predetermined area with the layer of transmissive material; and defining a boundary of the predetermined area as a transition region where the chromeless quartz mask transitions to the predetermined height of the added transmissive layer.

12. The fabrication method for a sub-micron geometry semiconductor device of claim 11, further including:

forming the transition region as a vertical step to the height of the added layer of transmissive material.

13. A method for fabricating a device which has sub-micron gate lengths using phase shift lithography comprising:

providing a transmissive mask for forming a gate of a semiconductor device wherein modifications to the mask produce phase shift differences between light passing through modified and unmodified areas of the transmissive mask;

directing light from an optical exposure system through the transmissive mask;

forming a sub-micron width non-exposed light sensitive material when light from the optical exposure system is projected through the transmissive mask to a semiconductor wafer, the light is patterned by using destructive interference due to the phase shift differences between the modified and unmodified areas of the transmissive mask;

forming a gate using the sub-micron line of non-exposed light sensitive material to form a closed loop gate;

forming a drain or source region in the area interior to the closed loop gate; and forming a drain or source region in the area exterior to the closed loop gate.

14. The method for fabricating a device which has sub-micron gate lengths using phase shift lithography of claim 13 further including:

modifying the transmissive mask to phase shift light 180 degrees out of phase from light passing through unmodified areas of the transmissive mask.

15. The method for fabricating a device which has sub-micron gate lengths using phase shift lithography of claim 14 further including:

forming a predetermined profile where the unmodified area of the transmissive mask transitions to the modified area of the transmissive mask as a vertical step.

16. The method for fabricating a device which has sub-micron gate lengths using phase shift lithography of claim 13 further including:

providing a positive photoresist material on the semiconductor wafer as a light sensitive material.

17. The method for fabricating a device which has sub-micron gate lengths using phase shift lithography of claim 13 further including:

providing the transmissive mask made of quartz;

modifying the transmissive mask in a predetermined area by etching the predetermined area to a predetermined depth;

defining a transition region as an area where the non-modified area of the transmissive mask transitions to the etched predetermined area of the transmissive mask, wherein the transition region forms a closed loop around the periphery of the etched predetermined area; and exposing light sensitive material on the semiconductor wafer through the transmissive mask.

18. A method for fabricating a MESFET device which has sub-micron gate lengths comprising:

forming a conductive area for the MESFET device in a gallium arsenide wafer;

depositing a metal gate material on the gallium arsenide wafer, wherein the metal gate material covers the conductive area;

placing a light sensitive photoresist on the metal gate material;

providing an optical exposure system for exposing the photoresist to light;

providing a chromeless mask which is transmissive to light from the optical exposure system and is used to pattern light to form a gate for the MESFET device wherein the mask is etched in a predetermined area, to a predetermined depth, thereby creating a phase difference between light passing through unmodified areas of the chromeless mask and the etched predetermined area;

aligning the optical exposure system to the chromeless mask;

aligning the chromeless mask to the gallium arsenide wafer, wherein the alignment places a projected dark region from the chromeless mask within the conductive area;

exposing the photoresist on the metal gate material with light from the optical exposure system, the light passes through the chromeless mask to expose the photoresist;

forming a sub-micron width closed loop non-exposed line of photoresist, wherein light projected from areas near the etched predetermined area boundary interacts destructively due to phase shift differences and the sub-micron width line of photoresist forms a closed loop shape corresponding to the etched predetermined area boundary;

removing exposed photoresist;

removing the metal gate material which is not protected by the non-exposed photoresist;

removing the non-exposed photoresist, thereby leaving a sub-micron closed loop gate on the gallium arsenide wafer;

forming a drain or source within a predetermined area interior to the closed loop gate; and forming a drain or source in a predetermined area exterior to the closed loop gate.

19. The method for fabricating a MESFET device which has sub-micron gate lengths of claim 18 further including:

using an I-line stepper as the optical exposure system wherein the I-line stepper produces light which has an average wavelength of 365 nanometers and produces a MESFET which has a gate length less than 0.5 microns.

20. The method for fabricating a MESFET device which has sub-micron gate lengths of claim 18 further including:

wherein the forming of the conductive area includes forming a plurality of conductive areas in which separate MESFET devices can be formed;

forming the sub-micron width closed loop non-exposed line of photoresist in a manner so that the non-exposed light sensitive material passes over each of the plurality of conductive areas in which separate MESFET devices can be formed;

providing an additional mask patterned with chrome in predetermined areas, the chrome patterned mask is used after the photoresist has been exposed with the chromeless mask, the chrome patterned mask is used to expose areas of the sub-micron width closed loop non-exposed line of photoresist to form isolated lines of non-exposed photoresist corresponding to each of the plurality of conductive areas;

aligning the chrome patterned mask to the gallium arsenide wafer;

projecting light from the optical exposure system through the chrome patterned mask, wherein light exposes predetermined areas of the sub-micron width closed loop non-exposed line of photoresist;

removing the exposed photoresist, wherein isolated lines of non-exposed photoresist have been formed corresponding to each of the plurality of conductive areas;

removing metal gate material which is not protected by the non-exposed photoresist;

removing the non-exposed photoresist, thereby leaving isolated gates in each of the plurality of conductive areas; and forming a source and drain for each isolated gate in each of the plurality of conductive areas.

* * * * *